US009925776B2

(12) United States Patent
Takahashi et al.

(10) Patent No.: US 9,925,776 B2
(45) Date of Patent: Mar. 27, 2018

(54) METHOD OF MANUFACTURING SEMICONDUCTOR CHIPS FOR LIQUID DISCHARGE HEAD

(71) Applicant: CANON KABUSHIKI KAISHA, Tokyo (JP)

(72) Inventors: Tomohiro Takahashi, Yokohama (JP); Toru Kawaguchi, Ebina (JP); Toshiyasu Sakai, Kawasaki (JP); Masataka Kato, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/623,281

(22) Filed: Jun. 14, 2017

(65) Prior Publication Data

US 2017/0361616 A1 Dec. 21, 2017

(30) Foreign Application Priority Data

Jun. 21, 2016 (JP) ................................ 2016-122469

(51) Int. Cl.

| | |
|---|---|
| ***H01L 21/71*** | (2006.01) |
| ***H01L 21/304*** | (2006.01) |
| ***B41J 2/16*** | (2006.01) |

(52) U.S. Cl.

CPC ............ *B41J 2/1635* (2013.01); *B41J 2/162* (2013.01); *B41J 2/1628* (2013.01); *B41J 2/1631* (2013.01); *B41J 2/1634* (2013.01)

(58) Field of Classification Search

CPC ............ H01L 21/3043; H01L 21/6836; H01L 21/304; B23K 26/00

See application file for complete search history.

(56) References Cited

U.S. PATENT DOCUMENTS

2010/0323526 A1* 12/2010 Kishimoto ............ B41J 2/1603 438/753

FOREIGN PATENT DOCUMENTS

| | | |
|---|---|---|
| JP | 2005268752 A | 9/2005 |
| JP | 2014220403 A | 11/2014 |

* cited by examiner

*Primary Examiner* — Mohammad Choudhry

(74) *Attorney, Agent, or Firm* — Canon U.S.A., Inc. IP Division

(57) ABSTRACT

A method of manufacturing a plurality of semiconductor chips for a liquid discharge head from a substrate includes forming trenches of a linear form through etching from the second surface along intended cutting portions, forming modified portions in the substrate by irradiating a laser beam from the first surface side along the intended cutting portions, and splitting the substrate into the plurality of semiconductor chips for a liquid discharge head, by cutting the substrate with stress applied to the modified portions. The intended cutting portions include inclined portions extending in a direction inclined with respect to a crystal orientation plane of the substrate and uninclined portions extending in a direction along the crystal orientation plane of the substrate, and the trenches are formed at least along the inclined portions.

8 Claims, 5 Drawing Sheets

METHOD OF MANUFACTURING SEMICONDUCTOR CHIPS FOR LIQUID DISCHARGE HEAD

BACKGROUND OF THE INVENTION

Field of the Invention

The disclosure relates to a method of manufacturing semiconductor chips for a liquid discharge head.

Description of the Related Art

In many cases, semiconductor chips are manufactured in the manner described below. Elements and the like to be mounted on a plurality of semiconductor chips are collectively formed on a single substrate named a wafer, and then the substrate is cut and split into the plurality of semiconductor chips.

Japanese Patent Application Laid-Open No. 2005-268752 discusses a method known as laser stealth dicing as a method for cutting the substrate as described above. By the method, a laser beam is condensed and focused at a point in the substrate to metamorphose a property inside, and then the substrate is split using cracks formed from the modified portion as a starting point by applying external force to the substrate. Japanese Patent Application Laid-Open No. 2005-268752 features a plurality of the modified portions formed in a thickness direction of the substrate to cut the substrate in a direction inclined with respect to a crystal orientation plane of the substrate without compromising cutting precision.

However, the number of times the laser beam is irradiated needs to be increased to form the plurality of modified portions in the thickness direction of the substrate. This requires a longer time for cutting the substrate, and thus results in a low productivity.

To address this problem, Japanese Patent Application Laid-Open No. 2014-220403 discusses the following method. A trench is formed through etching in a surface provided with an electrode of a substrate. Then, the substrate is irradiated with a laser beam from a rear surface to metamorphose the property inside and cut at a portion where the thickness is small due to the trench. By this method, the thickness of the substrate is reduced at the portion to be cut. Thus, the number of modified portions formed in the thickness direction can be reduced, so that the number of times the laser beam is irradiated can be reduced.

The method discussed in Japanese Patent Application Laid-Open No. 2014-220403 involves forming the trench on the surface on which the electrode is formed. Therefore, an area for forming the trench needs to be secured, which reduces a freedom in designing the semiconductor chip.

The laser beam is irradiated onto the rear surface opposite to the surface on which the electrode is formed with a dicing tape attached on the surface on which the electrode is formed. This dicing tape needs to be peeled off after the cutting. When the method discussed in Japanese Patent Application Laid-Open No. 2014-220403 is employed for a method of manufacturing semiconductor chips for a liquid discharge head, the dicing tape is attached on a channel forming member provided on an energy generating element on the substrate. In many cases, the channel forming member is subjected to a surface treatment to have high water repellency. The dicing tape attached to this surface may degrade the water repellency and adhesive may remain on the surface of the channel forming member.

SUMMARY OF THE INVENTION

According to an aspect of the disclosure, a method of manufacturing a plurality of semiconductor chips for a liquid discharge head is a method of manufacturing a plurality of semiconductor chips for a liquid discharge head from a substrate by cutting the substrate along intended cutting portions of a linear form, the substrate including a plurality of energy generating elements configured to generate energy used for discharging liquid, a plurality of liquid flow paths through which the liquid is supplied to the energy generating elements, a plurality of discharge ports through which the liquid is discharged, a first surface on which the energy generating elements are disposed, and a second surface which is a rear surface of the first surface. The method includes forming trenches of a linear form through etching from the second surface along the intended cutting portions, forming modified portions in the substrate by irradiating a laser beam from the first surface side along the intended cutting portions, and splitting the substrate into the plurality of semiconductor chips for a liquid discharge head, by cutting the substrate with stress applied to the modified portions. The intended cutting portions include inclined portions extending in a direction inclined with respect to a crystal orientation plane of the substrate and uninclined portions extending in a direction along the crystal orientation plane of the substrate. The trenches are formed at least along the inclined portions.

Further features and aspects of the disclosure will become apparent from the following description of numerous example embodiments with reference to the attached drawings.

DESCRIPTION OF THE EMBODIMENTS

Figure 1:
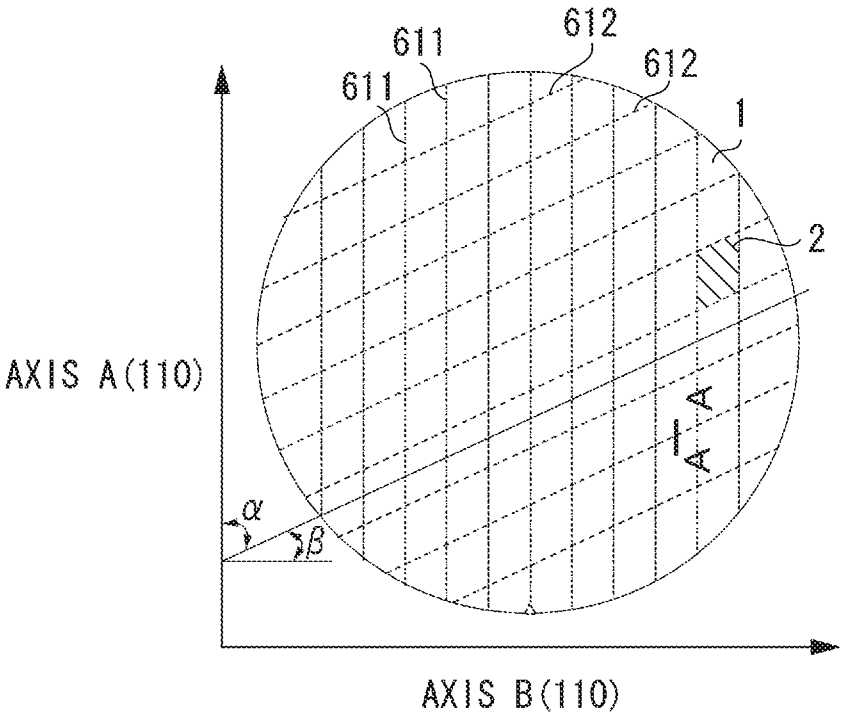
FIG. 1 is a schematic view of a layout of intended cutting portions of a substrate according to a first example embodiment.

Various example embodiments of the disclosure are described below with reference to the attached drawings. In this specification and the figures, redundant description may be omitted by denoting components having the same function with the same reference numeral.

The disclosure can achieve a method of manufacturing semiconductor chips for a liquid discharge head in which high cutting precision can be maintained while the design freedom is guaranteed, the number of times the laser beam is irradiated can be reduced, and the water repellency of the channel forming member can be maintained.

A first example embodiment is described below. FIG. 1 illustrates a layout of intended cutting portions on a substrate 1. Intended cutting portions 611 and 612 are each a part of the substrate 1 to be cut. The substrate 1 includes a plurality of the intended cutting portions 611 and a plurality of the intended cutting portions 612. The intended cutting portions 611 and 612 each have a linear form. The plurality of intended cutting portion 611 are arranged in parallel with each other, and the plurality of intended cutting portion 612 are arranged in parallel with each other. A direction in which the intended cutting portion 611 extends crosses a direction in which the intended cutting portion 612 extends. In a method of manufacturing semiconductor chips 2 according to the first example embodiment of the disclosure, the substrate 1 is cut along the intended cutting portions 611 and 612 having a linear form to be split into a plurality of the semiconductor chips 2. The intended cutting portion 611 is an uninclined portion extending in a direction along a crystal orientation plane of the substrate 1. The intended cutting portion 612 is an inclined portion extending in a direction inclined with respect to the crystal orientation plane of the substrate 1. In the present example embodiment, the substrate 1 is a silicon substrate, and the crystal orientation plane is a plane (hereinafter, referred to as a (110) plane) specified by a Miller index (110).

An intended cutting portion is regarded as being inclined with respect to the crystal orientation plane when an angle of 3° or more is formed between an extending direction of the intended cutting portion and the crystal orientation plane. In the silicon substrate used in the present example embodiment, an angle between the extending direction of the intended cutting portion and a (110) plane A axis is defined as $\alpha$ and an angle between the extending direction of the intended cutting portion and a (110) plane B axis is defined as $\beta$. An angle of 3° or more is formed between the intended cutting portion and the crystal orientation plane when each of $\alpha$ and $\beta$ is 3° or more. In an example illustrated in FIG. 1, the angle $\beta$ between the extending direction of the intended cutting portion 612 and the (110) plane B axis is 30°.

FIG. 2 is a schematic process chart illustrating the method of manufacturing semiconductor chips according to the first example embodiment of the disclosure. FIG. 2 is a cross-sectional view taken along line A-A in FIG. 1. The cross-sectional view taken along line A-A includes the intended cutting portion 612.

Figure 2A:
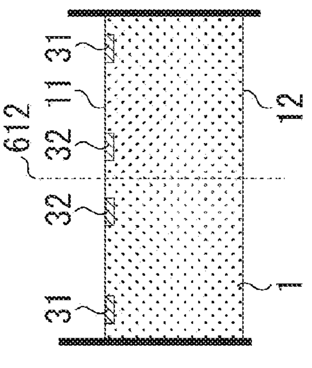
FIGS. 2A to 2G are schematic process charts illustrating a manufacturing method according to the first example embodiment.

The method of manufacturing semiconductor chips according to the first example embodiment of the disclosure includes preparing the substrate 1 provided with a plurality of energy generating elements 31 and metal wires 32 (FIG. 2A). The substrate 1 includes a first surface 11 and a second surface 12 which is a rear surface of the first surface 11. The energy generating elements 31 and the metal wires 32 are provided on the first surface 11 of the substrate 1. The energy generating element 31, a heater (electrothermal transducer element) for example, and a piezoelectric element, generates energy to be used for discharging liquid. The substrate 1 according to the present example embodiment has a thickness of 725 μm.

Figure 2B:
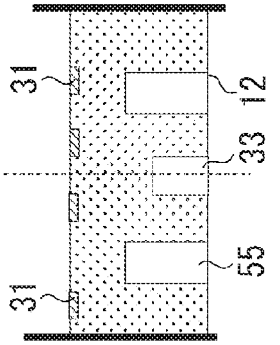

The method according to the present example embodiment further includes forming a trench 33 of a linear form, through etching from the second surface 12 of the substrate 1 (FIG. 2B). The trench 33 is formed along the intended cutting portions 611 and 612 such that the intended cutting portions 611 and 612 are included within the width of the trench 33. The trench 33 may have any depth selected as long as the trench 33 does not reach the first surface 11 and a strength of the substrate 1 can be ensured. The trench 33 according to the present example embodiment has a depth of 400 μm. The etching performed in this process is, for example, dry etching and wet etching. In the present case, reactive ion etching (RIE) was employed as one type of dry etching. In this process of forming the trench 33, a plurality of first liquid supply paths 55 is further formed. The first liquid supply paths 55 are flow paths for supplying liquid to the energy generating elements 31.

Figure 2C:
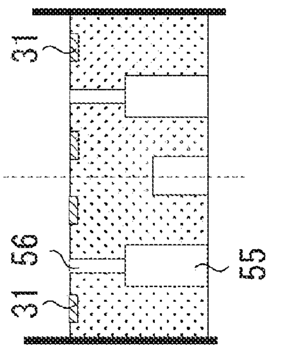

The method of manufacturing semiconductor chips further includes forming a plurality of second liquid supply paths 56 from the first surface 11 (FIG. 2C). The second liquid supply paths 56 are in communication with the first liquid supply paths 55, and are configured to supply liquid to the energy generating elements 31. This process can also be performed through etching as in the case of the process for forming the first liquid supply path 55. In the present example embodiment, RIE was employed.

Figure 2D:
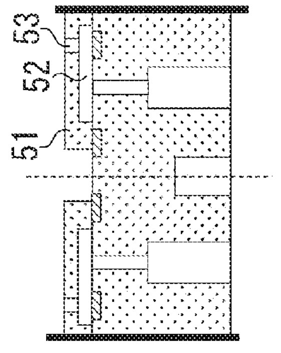

The method of manufacturing semiconductor chips further includes forming liquid flow paths 52 and discharge ports 53 on the substrate 1 by using channel forming members 51 (FIG. 2D). The channel forming member 51 is photosensitive resin. The liquid flow path 52 and the discharge port 53 are formed in each channel forming member 51 through photolithography. The channel forming member 51 has a surface coated with water repellent to have high water repellency.

Figure 2E:
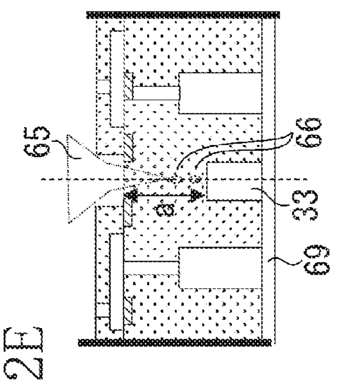
Figure 2F:
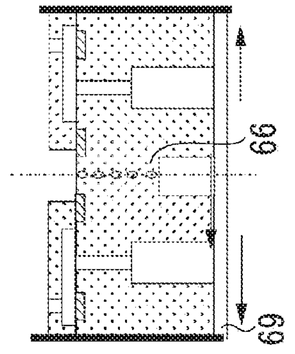

The method of manufacturing semiconductor chips further includes forming modified portions 66 in the substrate 1 by irradiating a laser beam 65 along the intended cutting portions 611 and 612 (FIG. 2E). In this process, a dicing tape 69 is attached on the second surface 12 of the substrate 1. The dicing tape 69 is used for protecting and fixing the substrate 1 during a dicing process on the substrate 1. The modified portion 66 is a polycrystalline portion as a result of irradiating a monocrystalline silicon substrate with a laser beam. In this process, the modified portion 66 having a low crystal strength, is formed in the substrate 1 with the laser beam 65 condensed and focused by an optical system including an objective lens. The laser beam 65 is irradiated along predetermined intended cutting portions. This process is known as laser stealth dicing. In the present example embodiment, the trenches 33 are formed along the intended cutting portions 611 and 612, so that the intended cutting portions 611 and 612 where the substrate 1 is to be cut have a thickness a=725-400=325 μm. In this process, the laser beam 65 is irradiated five times at different depths, whereby five layers of the modified portions 66 were formed in the thickness direction (FIG. 2F).

Figure 2G:
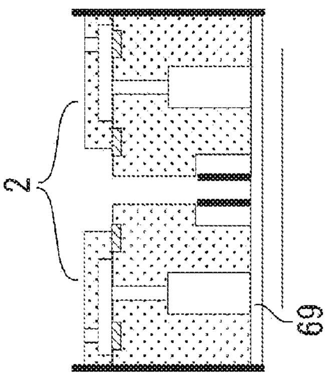

The method of manufacturing semiconductor chips further includes splitting the substrate 1 with cracks formed from the modified portions 66 as a starting point by applying stress on the modified portion 66 (FIG. 2G). In this process, the stress can be applied to the modified portions 66 by pulling the dicing tape 69.

Effects of First Example Embodiment

In the method of manufacturing semiconductor chips for a liquid discharge head according to the present example embodiment, a cutting precision of ±3 μm was achieved for the intended cutting portion 611 as the uninclined portion and a cutting precision of ±6 μm was achieved for the intended cutting portion 612 as the inclined portion.

In a comparative example, the silicon substrate 1, having a thickness of 725 μm with no trench 33 formed was cut with the laser beam irradiated six times at different depths in the thickness direction using laser stealth dicing. In this comparative example, the cutting precision for the intended cutting portion 611 was ±5 μm, and the cutting precision for the intended cutting portion 612 was ±15 μm.

Thus, it has been confirmed that the cutting precision can be largely improved by the method of manufacturing semiconductor chips for a liquid discharge head according to the present example embodiment. Furthermore, the cutting precision was improved although the number of times the laser beam is irradiated was reduced, which is five times in the present example embodiment. It may be because developing directions of the cracks between the modified portions 66 can be more easily controlled since the thickness a at the portion of the substrate 1 to be cut is thin, that is a=325 μm, so that a distance between the modified portions 66 is about 120 μm to about 65 μm.

According to the present example embodiment, the cutting precision can be improved without increasing the number of times the laser beam is irradiated, by decreasing the times of the laser beam emission while a higher productivity is achieved depending on conditions. Furthermore, an area for forming the trench is not required on the first surface 11 because the trench 33 is formed on the second surface 12. This configuration requires no dicing tape to be attached on the channel forming member 51, and thus the surface of the channel forming member 51 is free of degradation of the water repellency and the adhesive does not remain thereon.

A second example embodiment is described below. In a method of manufacturing semiconductor chips for a liquid discharge head according to the second example embodiment of the disclosure, the substrate 1 is cut at the intended cutting portions 611 and 612 laid out as illustrated in FIG. 1. This process is the same as those in the first example embodiment described with reference to FIG. 2. The present example embodiment is different from the first example embodiment in a condition for forming the trench 33. A difference from the first example embodiment is mainly described below.

The trenches 33 may be formed along both the intended cutting portions 611 as the uninclined portion with respect to the crystal orientation plane and the intended cutting portions 612 as the inclined portions. However, in this configuration, the strength of the substrate 1 may be degraded beyond a tolerable level, depending on the depth and the number of the trenches 33.

As described above, the substrate 1 includes the intended cutting portions 611 as the uninclined portions and the intended cutting portions 612 as the inclined portions. The intended cutting portions 612 as the inclined portions are easy to cut along the crystal orientation plane and thus show a higher cutting precision than the uninclined portions. Thus, according to the present example embodiment, the depth of the trench 33 formed along the intended cutting portion 611 as the uninclined portion is set smaller than that formed along the intended cutting portion 612 as the inclined portion. More specifically, the depth of the trench 33 formed along the intended cutting portion 611 is 150 μm, whereas the depth of the trench 33 formed along the intended cutting portion 612 is 400 μm. In this configuration, the laser beam was irradiated six times onto the intended cutting portion 611 on which the trench 33 was formed, and was irradiated five times onto the intended cutting portion 612 on which the trench 33 was formed.

In the present example embodiment, the cutting precision was ±6 μm at the intended cutting portion 612 as the inclined portion, and the cutting precision was ±4 μm at the intended cutting portion 611 as the uninclined portion. Thus, while the cutting precision at the intended cutting portion 611 was lower than the first example embodiment at the intended cutting portion 611 because the shallower trench 33 was formed, but the cutting precision was still higher than ±5 μm of the case where no trench 33 is formed.

Since the shallower trench 33 was formed along the intended cutting portion 611 as the uninclined portion, decrease of the strength of the substrate 1 can be smaller compared with the first example embodiment.

Further, when the cutting precision at the intended cutting portion 611 as the uninclined portion is sufficiently high and thus requires no improvement, the trench 33 may be formed only along the intended cutting portion 612 as the inclined portion, and does not need to be formed along the intended cutting portion 611 as the uninclined portion. This configuration can further suppress decrease of the strength of the substrate 1. In this configuration, the intended cutting portion 611 as the uninclined portion is in close contact with the dicing tape, and thus the intended cutting portion 611 may be cut by a method other than the laser stealth dicing such as blade dicing.

Figure 3:
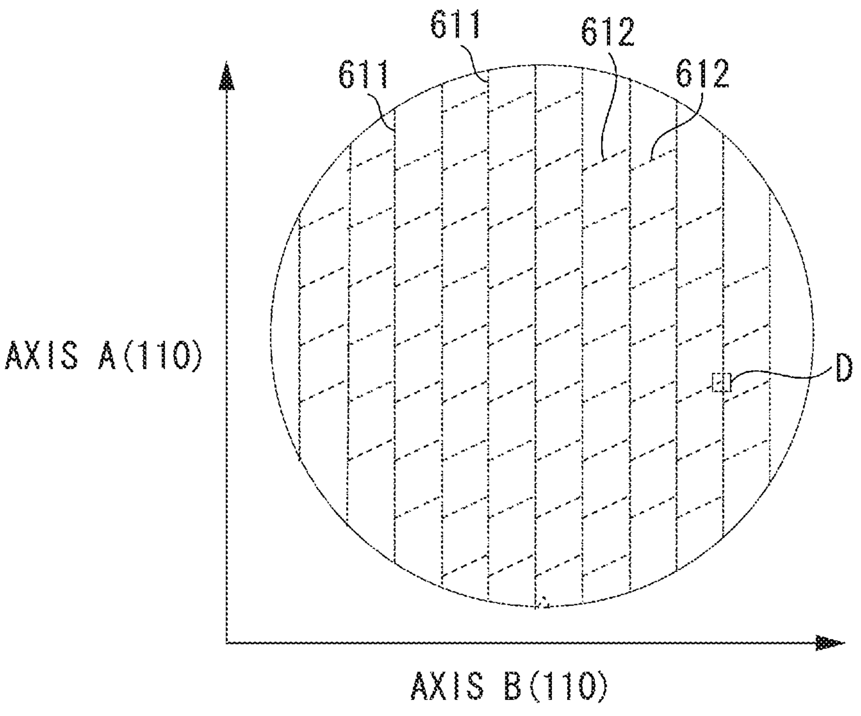
FIG. 3 is a schematic view of a layout of intended cutting portions of a substrate according to third to fourth example embodiments.

A third example embodiment is described below. A method of manufacturing semiconductor chips for a liquid discharge head according to the third example embodiment of the disclosure is different from the first and the second example embodiments in a layout of the intended cutting portions. FIG. 3 is a diagram illustrating the layout of the intended cutting portions according to the third example embodiment of the disclosure. A difference from the first and the second example embodiments is mainly described below.

As another solution for preventing the excessive decrease in the strength of the substrate 1 as a result of forming the trench 33, the intended cutting portion may be discontinuously formed. In the layout illustrated in FIG. 3, the plurality of intended cutting portions 611 as the uninclined portions are arranged in parallel with each other. The intended cutting portions 612 as the inclined portions are disposed between adjacent intended cutting portions 611. A plurality of intended cutting portions 612 adjacent to each other in the direction in which the intended cutting portions 611 are arranged is not continuously connected to each other. Thus, the intended cutting portions 612 as the inclined portions on adjacent semiconductor chips are not continuous, so that the accompanying trenches 33 are discontinuously formed. Thus, decrease of the strength of the substrate 1 is suppressed. Furthermore, the present example embodiment may employ the feature according to the second example embodiment. More specifically, the trench 33 formed along the intended cutting portion 611 may be shallower or may not be formed. With this configuration, decrease of the strength can be further suppressed.

A fourth example embodiment is described below. A method of manufacturing semiconductor chips for a liquid discharge head according to the fourth example embodiment of the disclosure further improves the cutting precision of the substrate 1 in the method according to the third example embodiment. A difference from the third example embodiment is mainly described below.

Figure 4A:
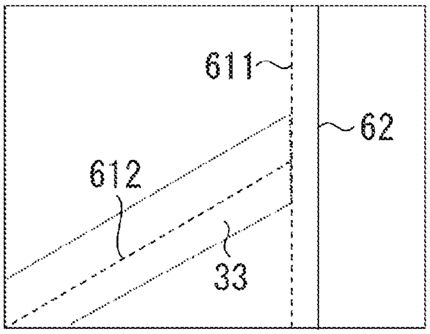
FIGS. 4A and 4B are each an enlarged view of an intersecting portion D illustrated in FIG. 3, representing a point to be improved by the fourth example embodiment.
Figure 4B:
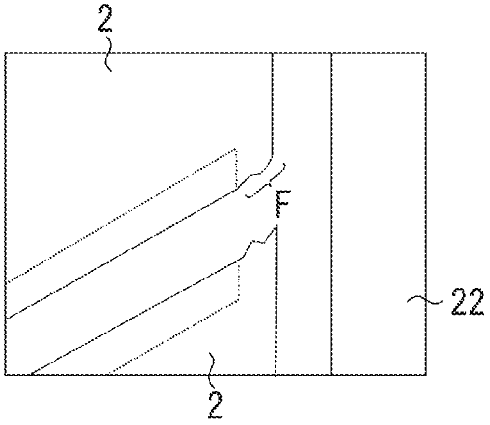

FIG. 4A is an enlarged view of an intersecting portion D between the intended cutting portion 611 and the intended cutting portion 612 according to the third example embodiment. The trench 33 formed along the intended cutting portion 612 as the inclined portion is formed up to a portion contacting the intended cutting portion 611. The position irradiated with the laser beam has an error, that is, fluctuates within a range of ±3 m for example. A line 62 in FIG. 4A represents a position actually irradiated with the laser beam along the intended cutting portion 611. The line 62 is deviated from the intended cutting portion 611 in a direction away from the intended cutting portion 612. The trench 33 formed along the intended cutting portion 612 does not reach the line 62 representing the irradiated position which is deviated from the intended cutting portion 611. Thus, the substrate 1 is not thin at an end portion F of the semiconductor chip 2. Thus, if the dicing tape is pulled to split the substrate 1 in this condition, the end portion F involves a meandering cutting line as illustrated in FIG. 4B because the modified portions are not sufficiently formed in the thickness direction of the substrate 1, which decreases a cutting precision.

Figure 5A:
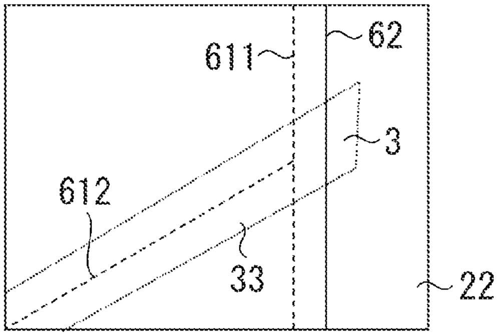
FIGS. 5A and 5B are each an enlarged view of the intersecting portion D illustrated in FIG. 3 according to the fourth example embodiment.
Figure 5B:
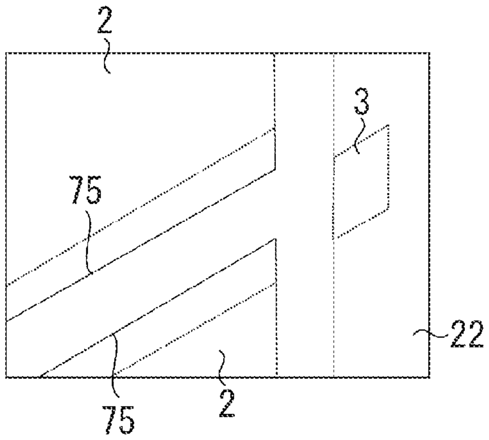

In view of the above, the trench 33 is formed to be longer than the intended cutting portion 612. Thus, the error in the irradiated position of the laser beam is considered in advance, so that the trench 33 and the line 62 irradiated with the laser beam can be in contact with each other even when the irradiated position of the laser beam is deviated. In this case, the trench 33 enters an adjacent chip 22 (FIG. 5A). In this configuration, a cut portion 75 cut along the intended cutting portion 612 as the inclined portion, is less likely to include a portion of the substrate 1 which is not thin even when the irradiated position of the laser beam is deviated. Thus, the cutting precision for the substrate 1 can be prevented from degrading.

The disclosure is described above with reference to the example embodiments. However, the disclosure is not limited to the example embodiments. The configurations and the details of the disclosure can be modified in various ways within the technical scope of the disclosure and the general knowledge of a person skilled in the art.

For example, in the example embodiment described above, the substrate 1 is a silicon substrate and the crystal orientation plane is a (110) plane. However, the disclosure is not limited to the example. For example, the substrate 1 may be a semiconductor substrate other than the silicon substrate. In such a case, the crystal orientation plane may be set to be a plane along which cutting can be easily performed in accordance with a property of a semiconductor of this substrate.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2016-122469, filed Jun. 21, 2016, which is hereby incorporated by reference herein in its entirety.

What is claimed is:

1. A method of manufacturing a plurality of semiconductor chips for a liquid discharge head from a substrate by cutting the substrate along intended cutting portions of a linear form, the substrate including a plurality of energy generating elements configured to generate energy used for discharging liquid, a plurality of liquid flow paths through which the liquid is supplied to the energy generating elements, a plurality of discharge ports through which the liquid is discharged, a first surface on which the energy generating elements are disposed, and a second surface which is a rear surface of the first surface, the method comprising: forming trenches of a linear form through etching from the second surface along the intended cutting portions;

forming modified portions in the substrate by irradiating a laser beam from the first surface side along the intended cutting portions; and splitting the substrate into the plurality of semiconductor chips for the liquid discharge head, by cutting the substrate with stress applied to the modified portions, wherein the intended cutting portions include inclined portions extending in a direction inclined with respect to a crystal orientation plane of the substrate and uninclined portions extending in a direction along the crystal orientation plane of the substrate, and wherein the trenches are formed at least along the inclined portions.

2. The method of manufacturing semiconductor chips for the liquid discharge head according to claim 1, wherein the trenches are formed along the inclined portions and along the uninclined portions, the trenches formed along the inclined portions being deeper than the trenches formed along the uninclined portions.

3. The method of manufacturing semiconductor chips for the liquid discharge head according to claim 1, wherein the trenches are formed along the inclined portions, and not formed along the uninclined portions.

4. The method of manufacturing semiconductor chips for the liquid discharge head according to claim 1, wherein the plurality of uninclined portions is arranged in parallel with each other, and wherein each of the inclined portions connecting the adjacent uninclined portions is arranged such that the uninclined portion does not form a continuous line with another uninclined portion.

5. The method of manufacturing semiconductor chips for the liquid discharge head according to claim 4, wherein the trenches are formed such that the trench formed along the inclined portions is longer than the inclined portions.

6. The method of manufacturing semiconductor chips for the liquid discharge head according to claim 1, wherein the substrate is a silicon substrate and the crystal orientation plane is a plane indicated by a Miller index (110).

7. The method of manufacturing semiconductor chips for the liquid discharge head according to claim 1, wherein the trench is formed by dry etching.

8. The method of manufacturing semiconductor chips for the liquid discharge head according to claim 1, wherein an angle of 3° or more is formed between an extending direction of the inclined portions and the crystal orientation plane.

* * * * *